(12) United States Patent
Okamoto (10) Patent No.: US 6,679,715 B2
(45) Date of Patent: Jan. 20, 2004

(54) SOCKET FOR ELECTRICAL PARTS (75) Inventor: Tadayuki Okamoto, Kawaguchi (JP)

(73) Assignee: Enplas Corporation, Kawaguchi (JP)

(*) Notice: Subject to any disclaimer, the term of this patent is extended or adjusted under 35 U.S.C. 154(b) by 0 days.

(21) Appl. No.: 10/152,631

(22) Filed: May 23, 2002

(65) Prior Publication Data
US 2002/0160641 A1 Oct. 31, 2002

Related U.S. Application Data (62) Division of application No. 09/714,231, filed on Nov. 17, 2000.

(30) Foreign Application Priority Data

Nov. 19, 1999 (JP) ............................................. 11-329749
Nov. 24, 1999 (JP) ............................................. 11-332234
Nov. 24, 1999 (JP) ............................................. 11-332523

(51) Int. Cl.[7] ................................................ H01R 11/22
(52) U.S. Cl. ...................................... 439/266; 439/330
(58) Field of Search ................................. 439/266, 265, 439/330, 267, 268, 269, 270; 357/74, 68, 79, 80; 174/52

(56) References Cited

U.S. PATENT DOCUMENTS

| 5,028,985 A | * | 7/1991 | Matsuoka ..................... 357/94 |
| 6,109,944 A | * | 8/2000 | Takeyama ..................... 439/266 |
| 6,213,803 B1 | | 4/2001 | Kato et al. | |

* cited by examiner

Primary Examiner—Alexander Gilman
(74) Attorney, Agent, or Firm—Staas & Halsey LLP (57) ABSTRACT A socket to be electrically connected to a terminal of an electrical part and having a socket body and upper and lower contact pins to contact and separate from the terminal of the electrical part. The upper contact pin includes an upper contact portion contacting an upper surface of the terminal, and the lower contact pin includes a lower contact portion contacting a lower surface of the terminal. When an operation member is reciprocally moved relative to the socket body, the upper contact portion contacts and separates, respectively, from the upper surface of the terminal. The socket body is provided with a partition wall section formed with a plurality of slits, into each of which at least a portion of the lower contact pin is inserted. The partition wall section is provided between the lower contact portions with a protruded portion projecting beyond an upper surface of the lower contact portions of the lower contact pin. When the electrical part is mounted on the socket, the terminal is guided by the protruded portion.

5 Claims, 11 Drawing Sheets

PRIOR ART

SOCKET FOR ELECTRICAL PARTS

This application is related to and is a divisional of application Ser. No. 09/714,231, filed Nov. 17, 2000, now allowed, which claims priority to Japanese Patent Application No. 11-329749, filed Nov. 19, 1999 and Japanese Patent Application No. 11-332234, filed Nov. 24, 1999 and Japanese Patent Application No. 11-332523, filed Nov. 24, 1999, the contents incorporated by reference herein.

BACKGROUND OF THE INVENTION

1. Field of the Invention

The present invention relates to a socket for an electrical part for detachably holding the electrical part such as semiconductor device (called "IC package" hereinlater), and more particularly, a socket for an electrical part including an improved structure of a contact pin to be electrically connected to a terminal of the electrical part and capable of finely positioning the terminal and smoothly mounting the electrical part to a socket body.

2. Description of the Related Art

As such a "socket for electrical parts", there is known an IC socket for detachably holding an IC package as an "electrical part". In such socket, the IC package is accommodated in a socket body, each of contact pins is arranged so as to contact, at two points, upper and lower surfaces of each of terminals of the IC package, and when an operation member is operated, an upper elastic piece of the contact pin is elastically deformed so that an upper contact portion of the upper elastic piece is contacted to or separated from the upper surface of the terminal of the IC package.

However, in such conventional two-point-contact structure, a lower contact portion of the elastic piece contacting the lower surface of the terminal is constructed 'to be stationary (fixed), and only the upper contact portion thereof is constructed to be deformable. Because of such structure, although a wiping effect can be achieved at the upper contact portion, the wiping effect cannot be achieved at the lower contact portion. Thus, the contact stability between the terminal of the IC package and the lower contact portion is not so good.

Furthermore, in such conventional two-point-contact structure, the terminal of the IC package is clamped between the lower and upper contact portions and the height (level) of the terminal is determined in a state that the upper and lower elastic pieces are balanced in force. Accordingly, there is a fear that the heights of the respective terminals are not uniform and, hence, the terminals are undesirably deformable. There is also a fear that contact pressures between the respective contact portions and the terminals differ and, hence, the good contact stability cannot be achieved.

Figure 14:
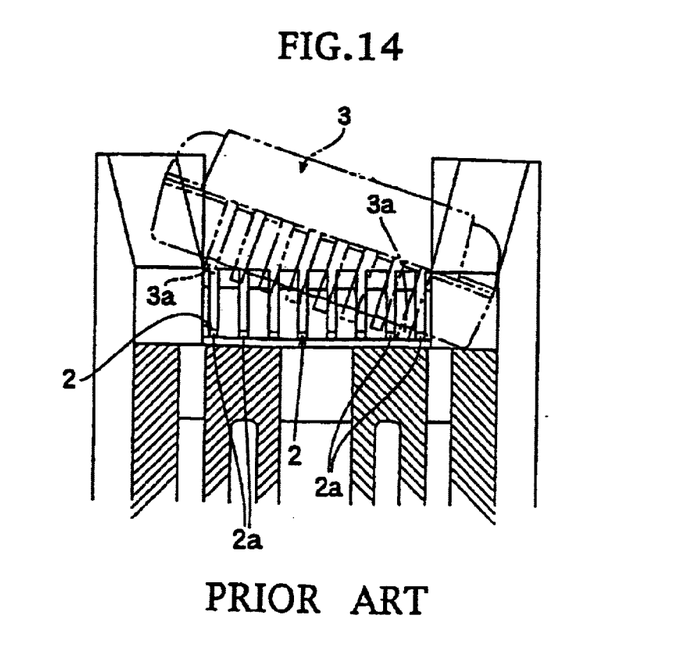
FIG. 14 is a view, corresponding to FIG. 7A, according to a conventional example.

Still furthermore, in such conventional two-point-contact structure, as shown in FIG. 14, lower contact portions 2a of the respective contact pin 2 project upward, and as shown with two-dot-chain line, when the IC package 3 is inserted in an inclined fashion, terminals 3a of the IC package 3 are inserted between the adjacent two lower contact portions 2a, which may result in an defective sitting or mounting thereof, thus being inconvenient.

SUMMARY OF THE INVENTION

A primary object of the present invention is to substantially eliminate defects or drawbacks encountered in the prior art mentioned above and to provide s socket for electrical parts capable of achieving a desired wiping effect at a lower contact portion of a contact pin to thereby improve stability in the contacting state thereof.

Another object of the present invention is to provide a socket for electrical parts capable of accurately positioning a terminal of an electrical part to thereby prevent deformation of the terminal and improve the contacting stability thereof.

A further object of the present invention is to provide a socket for electrical parts capable, of preventing undesired seating of the terminal at the time of mounting the electrical part to a socket body to thereby prevent defective seating or mounting of the terminal.

These and other objects can be achieved according to the present invention by providing, in one aspect, a socket for an electrical part adapted to be electrically connected to a terminal of an electrical part, comprising: a socket body; upper and lower contact pins mounted to the socket body so as to be contacted to and separated from the terminal of the electrical part, the upper contact pin being formed with an upper elastic piece having an upper contact portion contacting an upper surface of the terminal and the lower contact pin being formed with a lower elastic piece having a lower contact portion contacting a lower surface of the terminal; and an operation member disposed to the socket body to be vertically reciprocally movable with respect to the socket body, in which when the operation member is reciprocally moved, the upper elastic piece is elastically deformed to thereby displace the upper contact portion so as to be contacted to and separated from the upper surface of the terminal, wherein when the upper contact portion is contacted to the upper surface of the terminal of the electrical part so as to clamp the terminal between the upper and lower contact portions, the lower elastic piece is elastically deformed by an elastic force of the upper elastic piece to thereby displace the lower contact portion so that the terminal of the electrical part and the lower contact portion are slidably moved.

In a preferred embodiment of this, aspect, when the upper contact portion contacts the upper surface of the terminal so as to clamp the terminal between the upper and lower contact portions, the lower elastic piece is elastically deformed by the elastic force of the upper elastic piece and the lower contact portion is displaced in a direction reverse to the displacing direction of the upper contact portion so that the terminal of the electrical part and the lower contact portion are slidably moved.

In another example, when the upper contact portion contacts the upper surface of the terminal so as to clamp the terminal between the upper and lower contact portions, the lower elastic piece is elastically deformed by the elastic force of the upper elastic piece and the lower contact portion is displaced in a same direction as the displacing direction of the upper contact portion so that the terminal of the electrical part and the lower contact portion are slidably moved.

The upper contact pin and the lower contact pin are formed integrally as one member. According to the structure of the present invention of this aspect, the lower elastic piece is elastically deformed by using the elastic force of the upper elastic piece to thereby slide the lower contact portion on the lower surface of the terminal. Thus, the wiping effect can be achieved even by the lower contact portion to thereby improve the stability in contact.

In the embodiment in which the lower contact portion is displaced in a direction reverse to the displacing direction of the upper contact portion, a force from both the contact portions acting to the terminal of the electrical part can be cancelled each other, thus preventing the terminal from being deformed.

In another aspect of the present invention, there is also provided a socket for an electrical part adapted to be electrically connected to a terminal of an electrical part, comprising: a socket body; upper and lower contact pins mounted to the socket body so as to be contacted to and separated from the r terminal of the electrical part, the upper contact pin being formed with an upper elastic piece having an upper contact portion contacting an upper surface of the terminal and the lower contact pin being formed with a lower elastic piece having a lower contact portion contacting a lower surface of the terminal; an operation member disposed to the socket body to be vertically reciprocally movable with respect to the socket body, in which when the operation member is reciprocally moved, the upper elastic piece is elastically deformed to thereby displace the upper contact portion so as to be contacted to and separated from the upper surface of the terminal; and a positioning means for stopping the terminal of the electrical part to a predetermined position when the terminal of the electrical part is depressed by the upper contact portion.

In a preferred embodiment of this aspect, the socket body is provided with a partition wall section formed with a plurality of slits to which the lower contact portions of the lower contact pins are inserted to be movable, the slit having a width smaller than a width of the terminal and when the terminal is depressed by the upper contact portion of the upper contact pin, the positioning means operates to stop the terminal to the predetermined position by abutting the lower surface of the t terminal against an upper surface of the partition wall section.

When the upper contact portion is contacted to the upper surface of the terminal of the electrical part so as to clamp the terminal between the upper and lower contact portions, the lower elastic piece is elastically deformed by an elastic force of the upper elastic piece to thereby displace the lower contact portion so that the terminal of the electrical part and the lower contact portion are slidably moved.

The upper contact pin and the lower contact pin are formed integrally as one member. According to this aspect, the terminal of the electrical part is moved downward with being clamped between the upper and lower contact portions and are then positioned at a predetermined level by the positioning means, so that the deformation of the respective terminals can be prevented and the stable contacting state between the contact pins and the terminals can be ensured.

In the arrangement of the partition wall section formed with the slits, the terminals are stopped and positioned to the predetermined positions by narrowing the width of the slit than the width of the terminal, so that the deformation of the respective terminals can be prevented and the stable contacting state between the contact pins and the terminals can be ensured.

Furthermore, since the lower elastic piece is elastically deformed by using the elastic force of the upper elastic piece to thereby slide the lower contact portion on the lower surface of the terminal, the wiping effect can be achieved even by the lower contact portion to thereby improve the stability in the contacting state.

In a further aspect of the present invention, there is provided a socket for an electrical part adapted to be electrically connected to a terminal of an electrical part, comprising: a socket body; upper and lower contact pins mounted to the socket body so as to be contacted to and separated from the terminal of the electrical part, the upper contact pin being formed with an upper elastic piece having an upper contact portion contacting an upper surface of the terminal and the lower contact pin being formed with a lower elastic piece having a lower contact portion contacting a lower surface of the terminal; and an operation member disposed to the socket body to be vertically reciprocally movable with respect to the socket body, in which when the operation member is reciprocally moved, the upper elastic piece is elastically deformed to thereby displace the upper contact portion so as to be contacted to and separated from the upper surface of the terminal, wherein the socket body is provided with a partition wall section formed with a plurality of slits into each of which at least a portion of the lower contact pin is inserted and the partition wall section is provided with a protruded portion projecting over a level of an upper surface of the lower contact portion of the lower contact pin.

In a preferred embodiment of this aspect, a plurality of upper and lower contact pins are arranged and the protruded portion is formed to a portion of the partition wall section between one lower contact pin disposed endmost position and another one lower contact pin disposed adjacent thereto.

The protruded portion has a top surface portion formed to provide a round (R) shape. When the upper contact portion is contacted to the upper surface of the terminal of the electrical part so as to clamp the terminal between the upper and lower contact portions, the lower elastic piece is elastically deformed by an elastic force of the upper elastic piece to thereby displace the lower contact portion so that the terminal of the electrical part and the lower contact portion are slidably moved.

The upper contact pin and the lower contact pin are formed integrally as one member. According to this aspect, since the socket body is provided with the partition wall section formed with a plurality of slits into each of which at least a portion of the lower contact pin is inserted and the partition wall section is provided with the protruded portion projecting over a level of an upper surface of the lower contact portion of the lower contact pin, even if the electrical part is inserted in an oblique fashion, the terminal is guided by the upper surface portion of the protruded portion and corrected in its attitude to a normal attitude and then guided to the predetermined position on the lower contact portion. Thus, the terminal is not guided between adjacent two lower contact portions and the defective seating or mounting can be prevented.

In the arrangement that the protruded portion is formed to a portion of the partition wall section between one lower contact pin disposed endmost position and another one lower contact pin disposed adjacent thereto, the defective mounting of the electrical part can be further prevented.

By forming the top surface portion of the protruded portion so as to provide a round (R) shape, the terminal of the electrical part can be smoothly guided thereon.

The nature and further characteristic features of the present invention will be made more clear from the following descriptions made with reference to the accompanying drawings.

BRIEF DESCRIPTION OF THE DRAWINGS

In the accompanying drawings:

FIG. 5 includes perspective views showing a positional relationship between a terminal of the IC package and the contact pin of a socket body according to the first embodiment, in which

FIG. 7 represents states for accommodating the IC package to the socket body and includes FIG. 7A showing a state on the way of accommodation and FIG. 7B showing a state of completion of the accommodation;

FIG. 9 includes FIG. 9A being a front view of the IC package and FIG. 9B being a plan view thereof according to the first embodiment;

DETAILED DESCRIPTION OF THE DRAWINGS

Preferred embodiments of the present invention will be described hereunder with reference to the accompanying drawings.

Further, it is first to be noted that the terms such as "upper", "lower" and the like are used in the illustrated state of the socket for electrical parts or the state that the socket is disposed horizontally with the socket body being directed upward.

[First Embodiment]

The first embodiment of the present invention will be first described with reference to FIGS. 1 through 9.

In these figures, reference numeral 11 denotes an IC socket as a "socket for an electrical part" and the IC socket 11 is utilized for achieving an electrical connection between a terminal 12b of an IC package 12 (see FIGS. 9A and 9B) as an "electrical part" and a printed circuit board, not shown, of a measuring device such as tester for carrying out a performance test of the IC package 12.

Figure 9A:
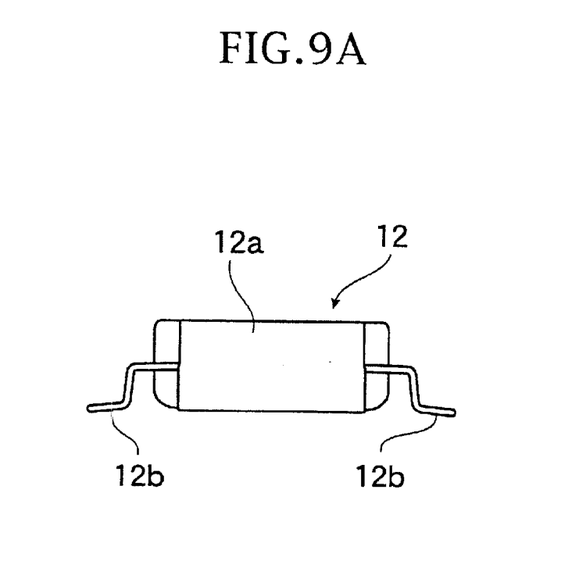
Figure 9B:
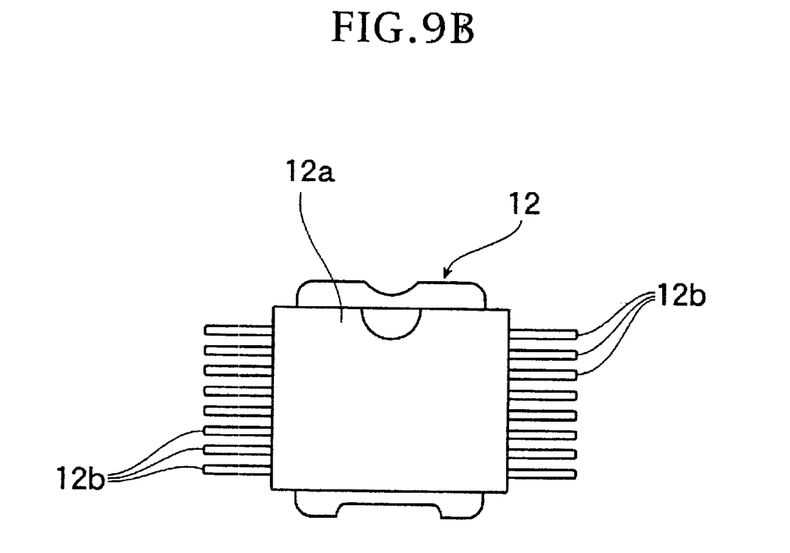

The IC package 12 is, as shown in FIGS. 9A and 9B, of so-called a gull-wing type in which a number of terminals project, each in crank-shape, sideways from opposing two sides of the rectangular package body 12a.

The IC socket 11 of this embodiment adopts a four-terminal structure (Kelvin contact system), and generally comprises a socket body 13 to be mounted to the printed circuit board. The socket body 13 has a base portion 13k on which a seating portion 13m is formed, and a mount portion 13a on which the IC package 12 is mounted is formed to this seating portion 13m. Furthermore, guide portions 13b are also formed to the socket body 13 at portions corresponding to the corner portions of the IC package body 12a for positioning the IC package 12 to a predetermined position, in which the IC package 12 is accommodated.

Figure 6:
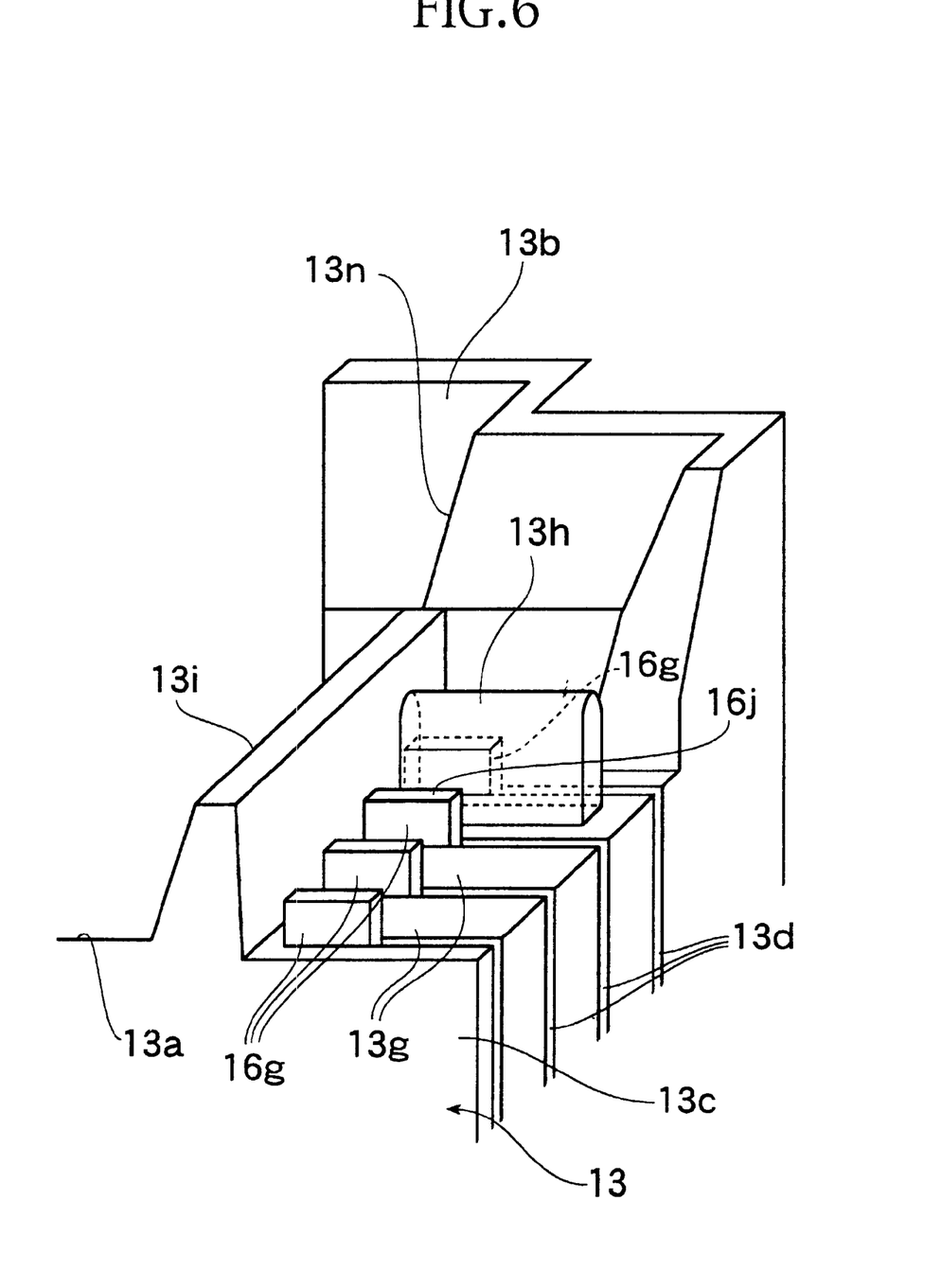
FIG. 6 is a perspective view showing the socket body provided with protruded (convex) portions according to the first embodiment.

Further, as shown in FIG. 6, partition wall sections 13c are formed to two sides, corresponding to the periphery of the mount portion 13a, between the guide portions 13b, and a plurality of slits 13d are formed to the partition wall sections 13c, respectively.

Furthermore, a number of upper contact pins 15 and lower contact pins 16, which are formed as independent members, are arranged to the socket body 13, and these contact pins 15 and 16 are deformable so as to be contacted to or separated from the terminals 12b of the IC package 12. An operation member 18, having a rectangular structure, for elastically deforming the upper contact pins 15 is also arranged to the socket body 13 to be vertically movable in an illustrated usable attitude.

Figure 2:
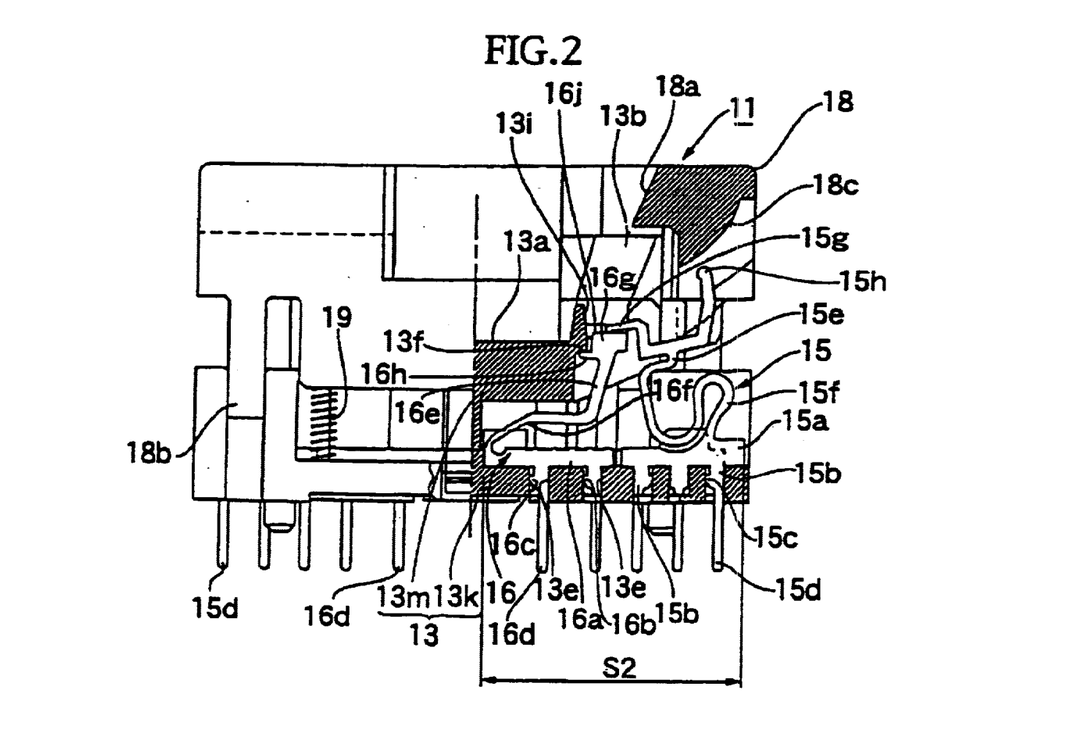
FIG. 2 is a sectional view taken along the line II—II in FIG. 1.

These upper and lower contact pins 15 and 16 have shapes shown in FIG. 2 and formed of a springy and electrically conductive material.

More in detail, the contact pins 15 and 16 are provided with stationary portions 15a and 16a constituting lower side bases and press-fit projections 15b and 16b extending downward from the stationary portions 15a and 16a, respectively. These projections 15b and 16b are formed with biting (engaging) projecting pieces 15c and 16c and press-fitted into press-fit holes 13e formed to the socket body 13 so that the biting projecting pieces 15c and 16c bite (firmly engage with) the inner wall portions of the press-fit holes 13e. Lead portions 15d and 16d extend so as to project downward from optional biting projecting pieces 15c and 16c, and these lead portions 15d and 16d are inserted into insertion holes formed to the printed circuit board and then soldered thereto.

In the upper contact pin 15, an upper elastic piece 15e extends upward from the stationary portion 15a and, on the other hand, in the lower contact pin 16, a lower elastic piece 16e extends upward from the stationary portion 16a.

A spring portion 15f is further formed to be continuous from the upper elastic piece 15e so as to provide an approximately S-shape, and an upper contact portion 15g is formed from an upper end portion of the spring portion 15f towards inside the socket body 13 and an operation piece 15h is also formed from the upper end portion thereof towards outside the socket body 13. The upper contact portion 15g is contacted to or separated from the upper surface portion of the terminal 12b of the IC package 12, and the operation piece 15h is depressed by the lowering motion of the operation member 18 to thereby elastically deform the spring portion 15f and displace outward the upper contact portion 15g.

Further, the lower contact pin 16 provides so-called a horse-shoe shape, and the lower elastic piece 16e extends obliquely outward in an upward direction from the inner end portion of the stationary portion 16a to the socket body 13, and a lower contact portion 16g is also formed through the spring portion 16f.

The lower contact portion 16g has approximately a rectangular shape and an engagement projection 16h is formed thereto at the inner end edge side of the socket body 13. This engagement projection 16h is engaged with an engagement step 13f formed to the socket body 13 to thereby restrict an upward movement of the lower contact portion 16g.

When the upper contact portion 15g contacts the upper surface of the terminal 12b of the IC package 12 and the terminal 12b is then clamped between the upper and lower contact portions 15g and 16g, the lower elastic piece 16e is elastically deformed by the upper elastic piece 15e, the lower contact portion 16g is hence displaced and the lower and upper contact portions 16g and 15g are slid with respect to the terminal 12b of the IC package 12. Furthermore, at this sliding operation, the lower contact portion 16g is displaced in a direction reverse to that of the upper contact portion 15g.

Figure 5A:
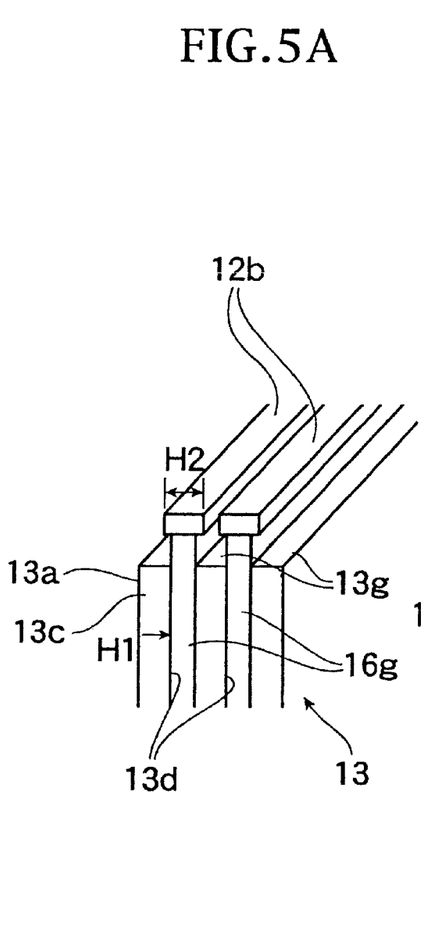
FIG. 5A shows a state before an upper contact portion of the contact pin contacts the terminal of the IC package.
Figure 5B:
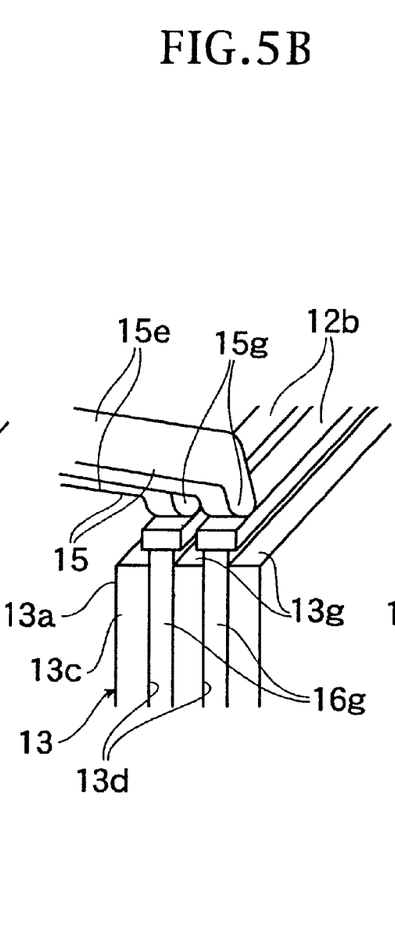
FIG. 5B shows an initial contact state of the upper contact portion of the contact pin to the terminal.
Figure 5C:
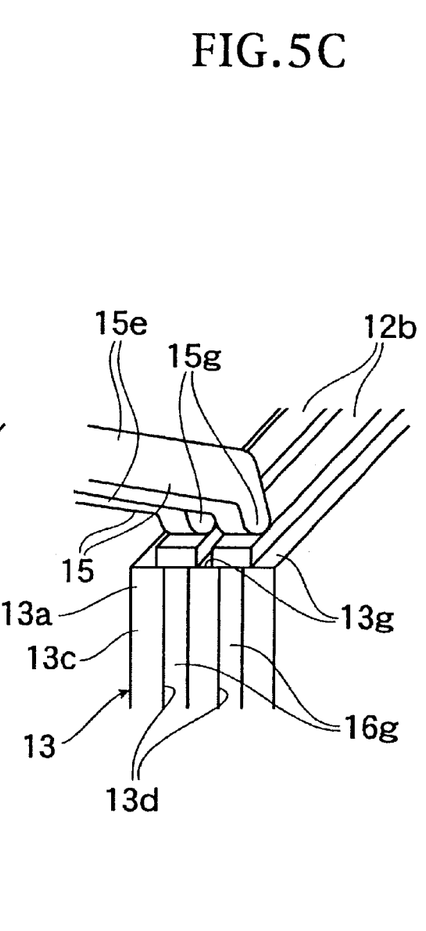
FIG. 5C shows a state that the terminal of the IC package is depressed by the upper contact portion.

As mentioned hereinbefore, the partition wall sections 13c formed with the slits 13d are disposed to the periphery of the mount portion 13a of the socket body 13, and the lower contact portions 16g of the respective lower contact pins 16 are inserted to be vertically movable. As shown in FIGS. 5A, 5H and 5C, the width H1 of the slit 13d is set to be smaller than the width H2 of the terminal 12b of the IC package 12, and under a state that a force of the upper contact pin 15 is not applied to the lower contact portion 16g of the lower contact pin 16, the upper portion of the lower contact portion 16g projects upward over an upper surface 13g of the partition wall section 13c. When the terminal 12b of the IC package 12 is depressed downward, the lower surface of the terminal 12b abuts against the upper surface 13g of the partition wall section 13c, thus restricting the lowering motion of the terminal 12b.

Furthermore, as shown in FIG. 6, the partition wall section 13c is formed with a protruded portion 13h at a portion between one lower contact portion 16g disposed at the most outside position and another lower contact portion 16g adjacent thereto, and the top (upper) portion of the protruded portion 13h is beyond the upper surfaces 16j of the lower contact portions 16g, the top portion being formed as a round surface having an R-shape.

Still furthermore, inside the protruded portion 13h, is formed a mold guide 131 for holding the side portion of the package body 12a.

Figure 1:
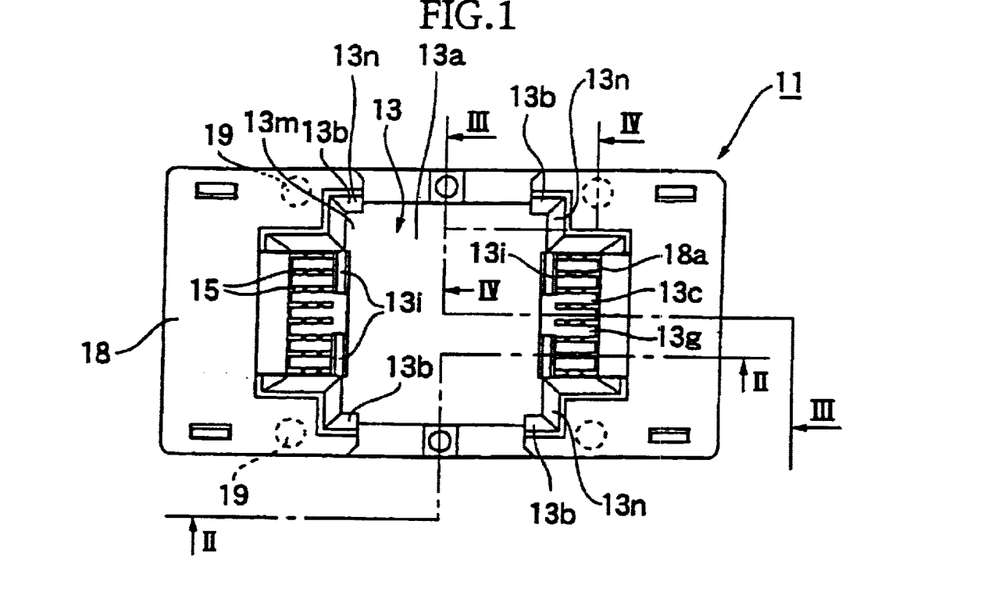
FIG. 1 is a plan view of an IC socket according to a first embodiment of the present invention.

The operation member 18 is formed, as shown in FIGS. 1 and 2, ~ with van opening 18a having a size capable of being inserted with the IC package 12, and the IC package 12 is inserted through this opening 18a and then mounted on the upper side portion of the mount portion of the socket body 13.

Figure 3:
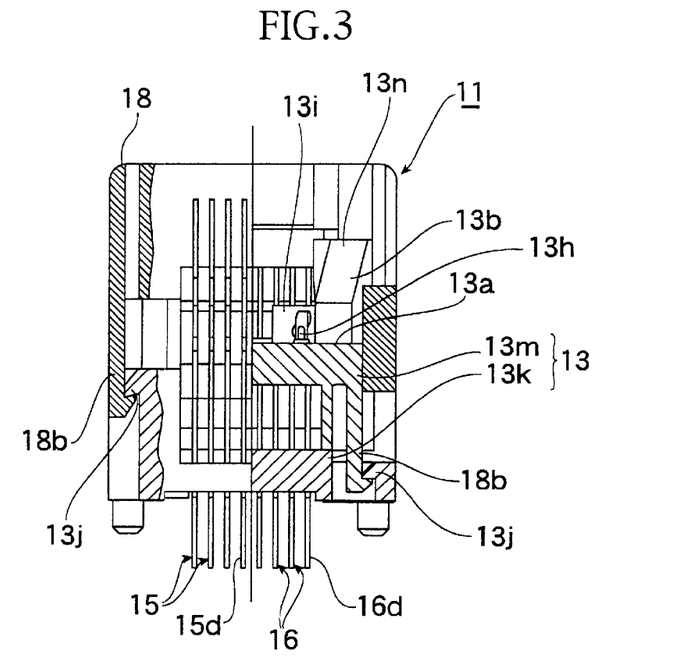
FIG. 3 is a sectional view taken along the line III—III in FIG. 1.
Figure 4:
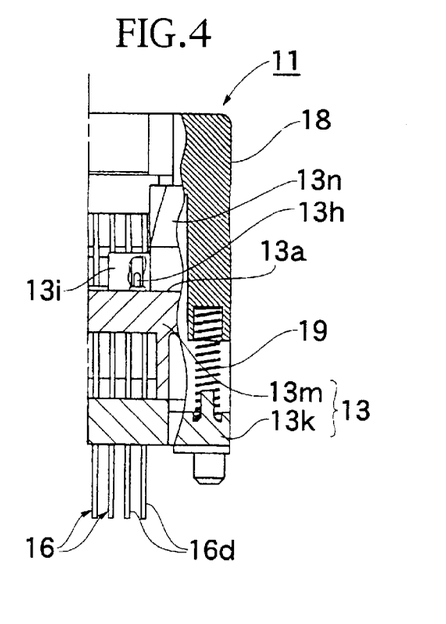
FIG. 4 is a sectional view taken along the line IV—IV in FIG. 1.

The operation member 18 is disposed to be vertically movable with respect to the socket body 13 as mentioned before and urged upward by means of spring 19. When the operation member 18 is moved at the most upward position, as shown in FIG. 3, an engaging pawl 18b is engaged with an engagement portion 13j of the socket body 13 to thereby prevent the operation member 18 from being removed.

Furthermore, the operation member 18 is formed with a cam portion 18c slidably contacting the operation piece 15h of the upper contact pin 15. When the operation member 18 is lowered, the operation piece 15h of the upper contact pin 15 is pressed by the cam portion 18c of the operation member 18 and tilted outward, the spring portion 15f is elastically deformed, and then, the upper contact portion 15g is displaced obliquely outward to be opened.

In the IC socket 11 of the structure mentioned above, the IC package 12 is mounted to the socket body 13 in the manner mentioned hereunder.

At first, the operation member 18 is depressed downward against the urging force of the spring 19. Then, the operation piece 15h of the upper contact pin 15 is pressed and the upper contact portion 15g is moved outside obliquely upward against the elastic property (springy force) of the spring portion 15f. Thus, the upper contact portion 15g is retired from the insertion range of the IC package 12 (see a position (1 shown in position ① shown in FIG. 8 with two-dot-chain line).

Under the state, the IC package 12 is inserted through the opening 18a of the operation member 18 so that the respective terminals 12b of the IC package 12 are mounted on the lower contact portions 16g of the lower contact pins 16, respectively.

Figure 7A:
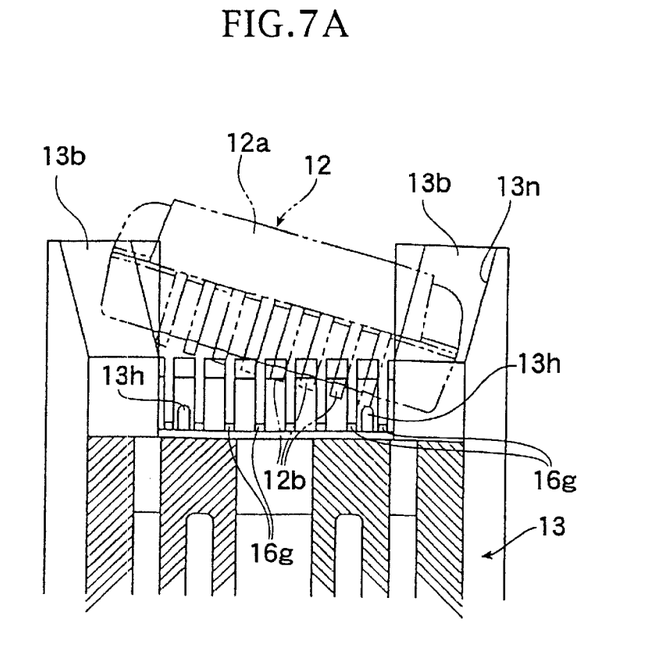
Figure 7B:
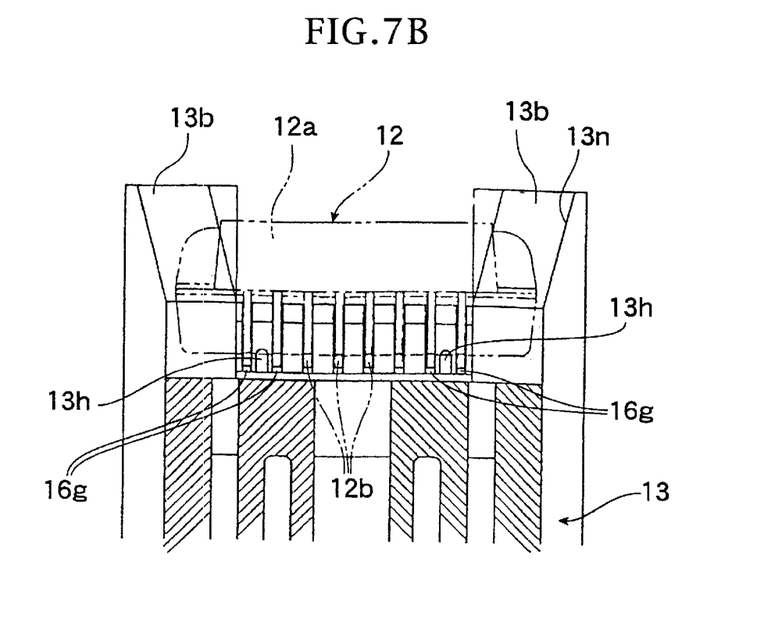

During this operation, when the IC package 12 is guided by a tapered portion 13n of the guide portion 13b of the socket body 13, there occurs a case, sometimes, that the IC package 12 is inserted obliquely. However, according to the present invention, as mentioned above, since the protruded portion 13h is formed to a predetermined position of the partition wall section 13c of the socket body 13, the terminal 12b is guided by the round top portion of the protruded portion 13h and the position or attitude of the IC package 12 is corrected to a normal, i.e. correct attitude and then mounted on the predetermined lower contact portion 16g (see FIG. 7H). Accordingly, the terminal 12b disposed at endmost position is prevented from being intruded between adjacent two lower contact portions 16g and from being adversely mounted. Moreover, the top portion of this protruded portion 13h has the round (R) shape, so that the terminal 12b is less engaged therewith and can be smoothly guided.

Figure 8:
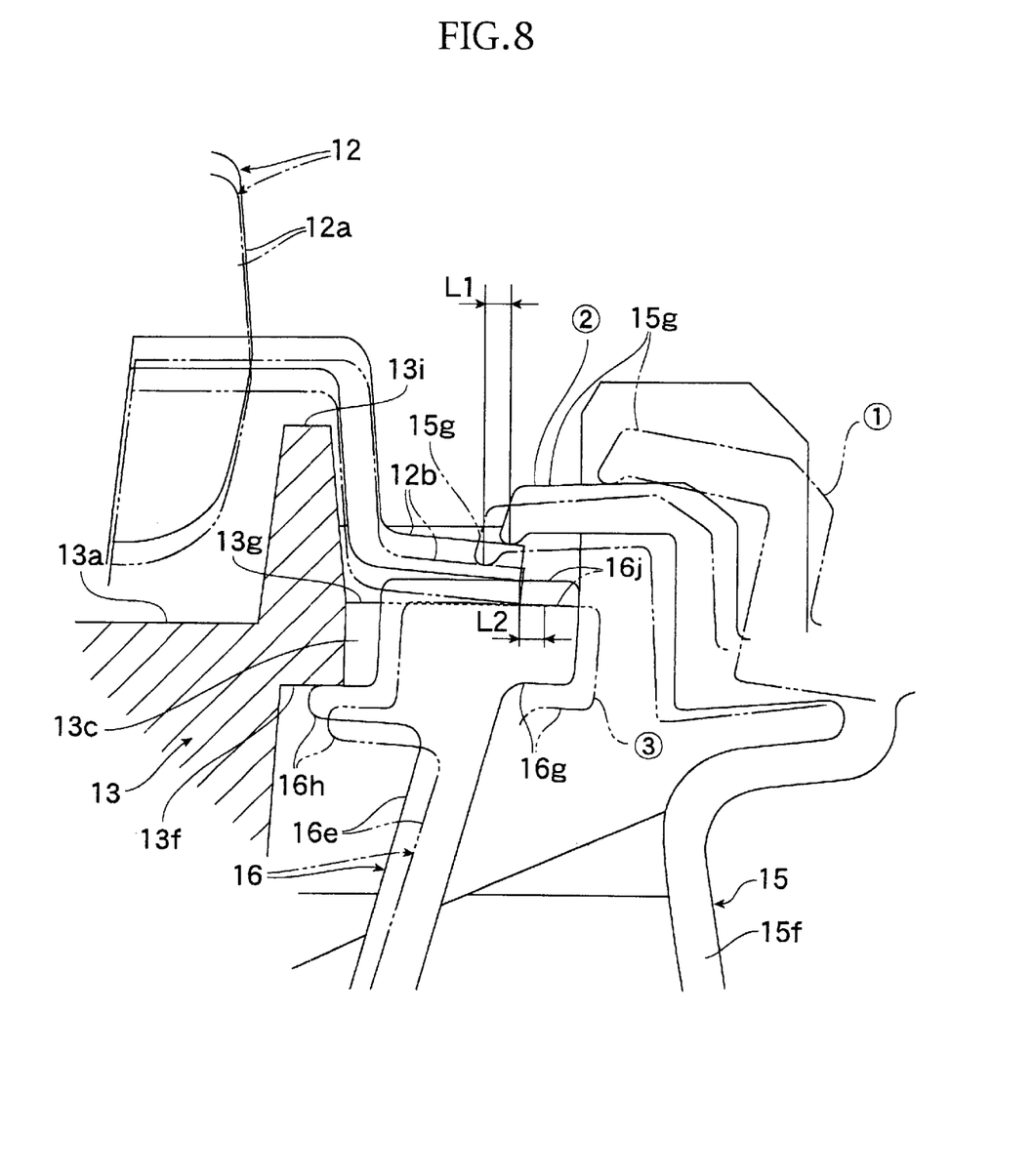
FIG. 8 is an illustrated sectional view showing movements of the contact portions of the contact pin and the terminal of the IC package according to the first embodiment.

Thereafter, when the pressing force to the operation member 18 is released, the operation member 18 is moved upward by the urging force of the spring 19 and the upper contact pin 15, the upper contact pin 15 is returned to its initial position by the elastic force of the spring portion 15f, and the upper contact portion 15g then abuts against the upper surface of the terminal 12b (see a position ② shown in FIG. 8 with solid line).

Further, the elastic force of the spring portion 15f of the upper contact pin 15 is set to be larger than that of the spring portion 16f of the lower contact pin 16, so that the upper contact portion 15g is slid and displaced, by a distance L1 in FIG. 8, on the upper surface of the terminal 12b in an obliquely downward direction, thereby achieving the wiping effect by the upper contact portion 15g.

Furthermore, since the lower contact pin 16 has a horseshoe shape, the lower elastic piece 16e of the lower contact pin 16 is elastically deformed by the depressing force of the upper contact pin 15 to thereby slide and displace the lower contact portion 16g by a distance L2 on the lower surface of the terminal 12b in an obliquely downward direction opposing to that of the upper contact portion 15g (see a position ③ shown in FIG. 8 with two-dot-chain line), thereby also achieving the wiping effect by the lower contact portion 16g by utilizing the elastic force of the upper contact pin 15.

Accordingly, as mentioned above, the wiping effect can be achieved by the lower contact portion 16g as well as the upper contact portion 15g, thus realizing an improved contact stability.

Still furthermore, when the terminal 12b is moved downward with being interposed between the upper and lower contact portions 15g and 16g by the elastic force of the upper contact pin 15 from the state shown in FIG. 5H in which the upper contact pin 15 abuts against the upper surface of the terminal 12b, the terminal 12b abuts against the upper surface 13g of the partition wall section 13c of the socket body 13 because the width H2 of the terminal 12 is made wider than the width H1 of the slit 13d.

Moreover, according to the described embodiment, since the upper and lower contact portions 15g and 16g are moved in directions different from each other so as to attain the wiping effect, the forces applied from both the contact portions 15g and 16g to the terminal 12b are cancelled each other, so that any excessive force will not be applied to the terminal 12b to thereby prevent the terminal 12b from being deformed.

In the manner mentioned above, the positioning of the terminal 12b of the IC package 12 is performed, and hence, the respective terminals 12b can be prevented from being deformed and the stable contacting state between the terminals 12b and the contact pins 15 and 16, respectively. That is, in the state that such positioning as that mentioned above is not performed, the terminals 12b are positioned at portions at which the contact pins 15 and 16 and the terminals 12b are balanced in their forces. Accordingly, in a case where the elastic forces of the contact pins 15 and 16 clamping the respective terminals 12b are not uniform (i.e. different), there is a fear that the terminals 12b are held at different positions and hence deformed. On the contrary, according to the present invention, as mentioned above, all the terminals 12b are positioned on the upper surface of the partition wall section 13c to thereby prevent the deformation of the terminals 12b. Furthermore, since the contacting pressures of the respective pins 15 and 16 are set with reference to the upper surface 13g of the partition wall section 13c, the contacting pressures to the respective terminals 12b can be made uniform, thus ensuring the contact stability thereof.

In this first embodiment, the positioning means is constituted by setting the width H1 of the slit 13d of the socket body 13 and the width H2 of the terminal 12b of the IC package 12 as mentioned above.

Further, in the described first embodiment, the partition wall section 13c is formed with the protruded portion 13h at the portion between one lower contact portion 16g disposed at the endmost position and another lower contact portion 16g adjacent thereto, but the present invention is not limited to this arrangement and the protruded portion 13h may be formed more inside, and the number of the protruded portion 13h may be increased, for example, to two, three or more as occasion demands. However, in order to effectively achieve the function of preventing the mounting defect of the IC package by a reduced number of protruded portion, the arrangement thereof described above with reference to the first embodiment will be more preferable.

Further, it is to be noted that in the above or below, the contact pins and/or terminals and their associated portions or members are described with reference to one contact pin and/or terminal, but the other ones thereof are substantially the same as those described in their structures and functions.

[Second Embodiment]

Figure 10:
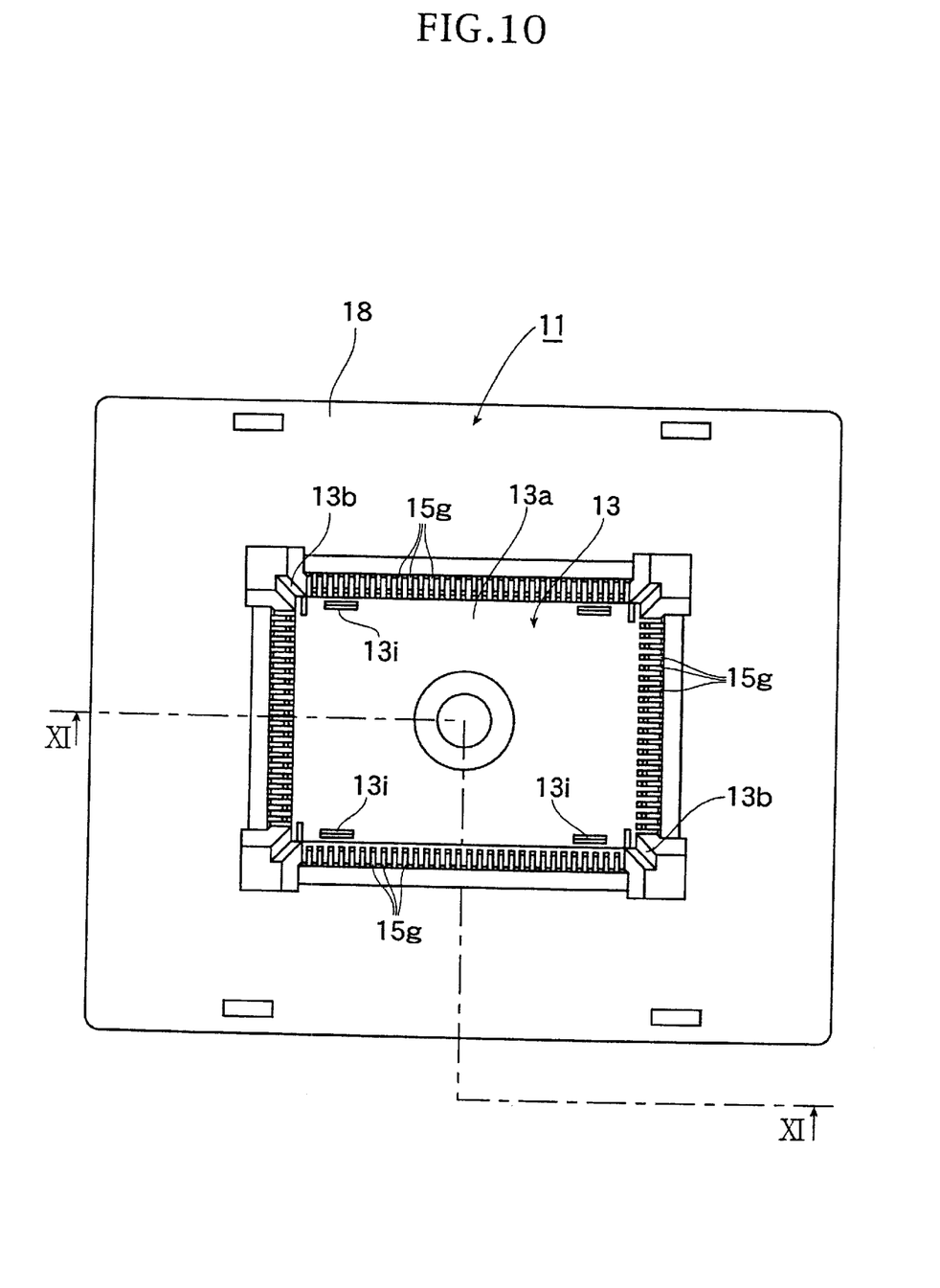
FIG. 10 is a plan view of an IC socket according to a second embodiment of the present invention.
Figure 11:
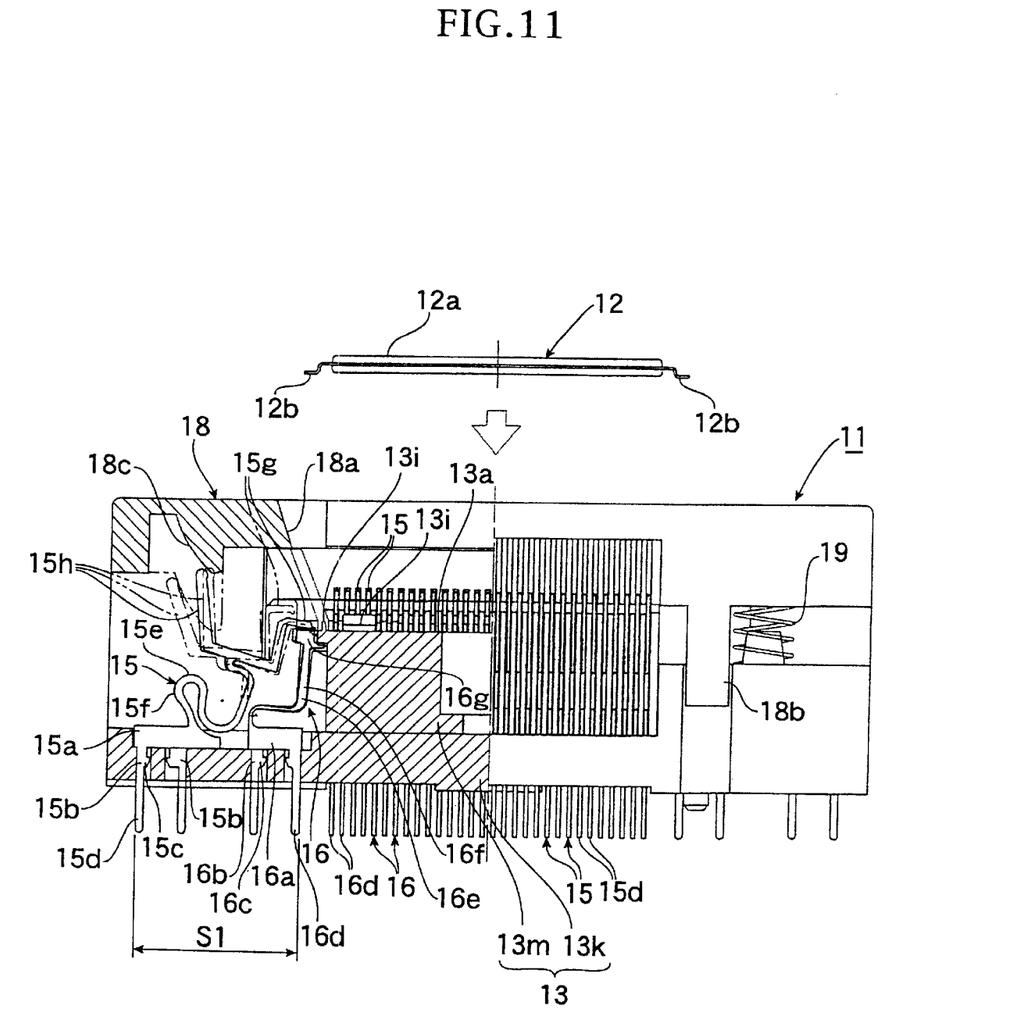
FIG. 11 is a sectional view taken along the line XI—XI in FIG. 10 according to the second embodiment.

FIGS. 10 and 11 represent the second embodiment of the present invention.

In this second embodiment, the upper and lower contact pins 15 and 16 are arranged so as to correspond to four sides of the rectangular mount portion 13a of the socket body 13.

In this embodiment, the lower contact portion 16g of the lower contact pin 16 is displaced in a direction different from that of the first embodiment, that is, the lower contact portion 16g is formed so as to take the same displacing direction as that of the upper contact portion 15g. According to this structure, the locating space S1 of both the contact pins 15 and 16 can be made smaller than that S2 in FIG. 2 of the first embodiment. Since the location space of the lower contact pin 16 is not intruded inside the socket body 13 as in the first embodiment, the upper and lower contact pins 15 and 16 can be arranged so as to correspond to the four sides of the rectangular mount portion 13a.

The other structures and functions of this second embodiment are substantially the same as those of the first embodiment, so that the details thereof are omitted herein.

[Third Embodiment]

Figure 12:
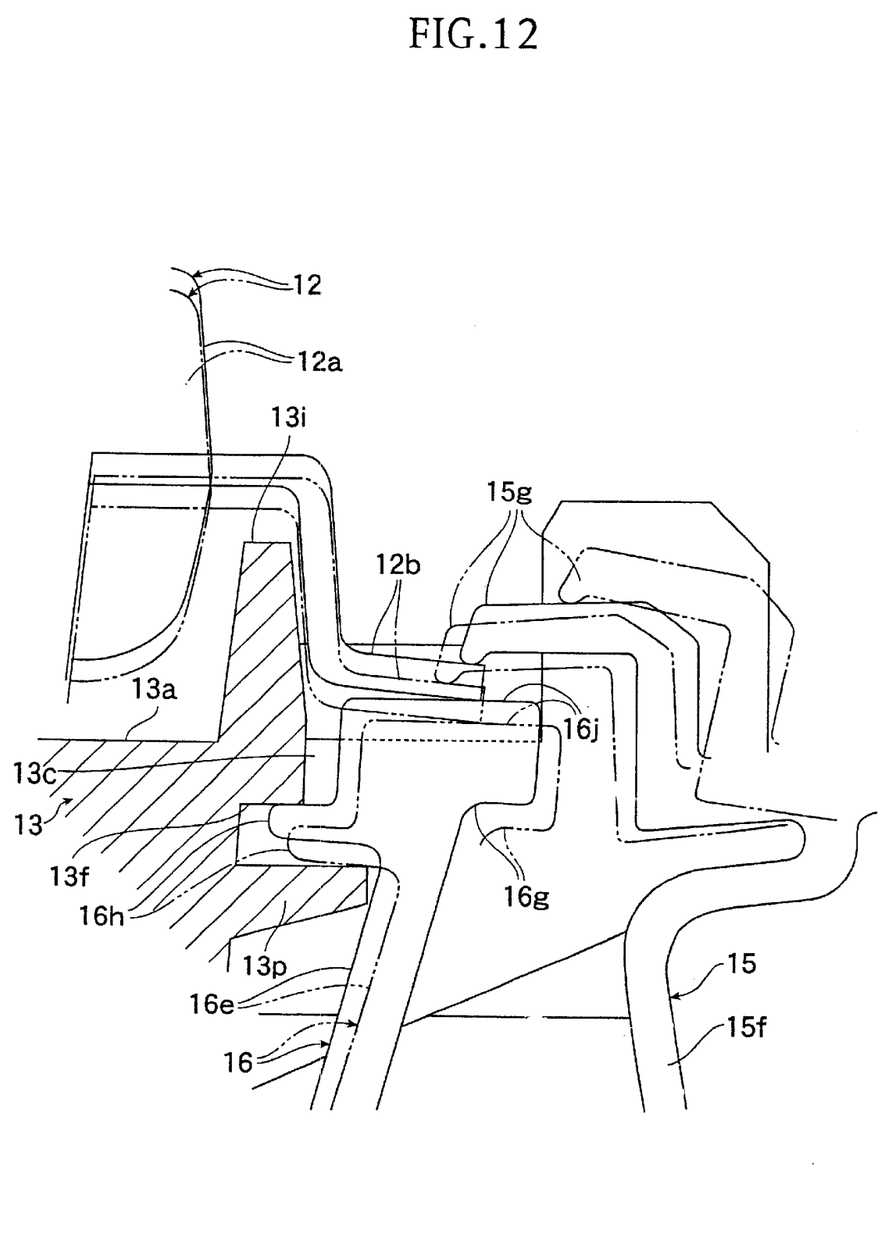
FIG. 12 is a sectional view, corresponding to FIG. 8, according to a third embodiment of the present invention.

FIG. 12 represents the third embodiment of the present invention.

With reference to FIG. 12, in this third embodiment, a position regulation section 13p is formed to the socket body 13, whereas, in the former embodiment, the lower surface of the terminal 12b of the IC package 12 abuts against the upper surface 13g of the partition wall section 13c of the socket body 13 to thereby position the terminal 12b.

According to the structure of this third embodiment, the lower contact pin 16 is elastically deformed by the elastic force of the upper contact pin 15, and the upper contact portion 15g is displaced to a position shown in FIG. 12 with solid line to a position shown with two-dot-chain line. At this position, the engaging projection 16h of the lower contact pin 16 abuts against the position regulation section 13p, and as a result, the terminal 12b abutting against the upper side portion of the lower contact portion 16g is positioned.

In this embodiment, the positioning means is mainly composed of the position regulation section 13p and the engaging projection 16h.

The other structures and functions of this third embodiment are substantially the same as those of the first embodiment, so that the details thereof are omitted herein.

[Fourth Embodiment]

Figure 13:
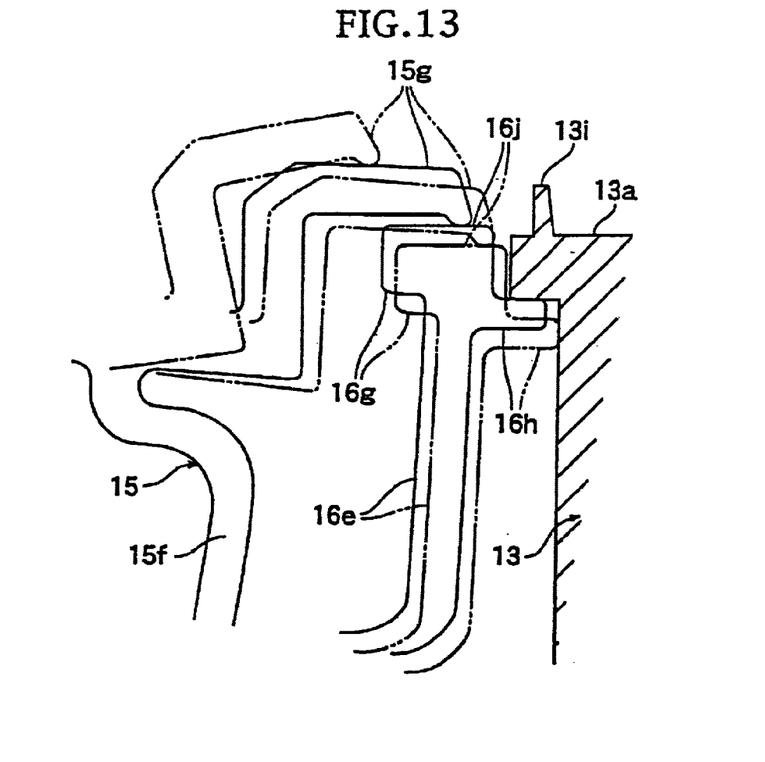
FIG. 13 is a sectional view of a fourth embodiment of the present invention.

FIG. 13 represents the fourth embodiment of the present invention.

With reference to FIG. 13, according to the structure of this fourth embodiment, the lower contact pin 16 is elastically deformed by the elastic force of the upper contact pin 15, and the upper contact portion 15g is displaced to a position shown in FIG. 13 with solid line to a position shown with two-dot-chain line. At this position, the front end of the engaging projection 16h of the lower contact pin 16 abuts against the side wall section of the socket body 13, and as a result, the terminal 12b abutting against the upper side portion of the upper contact portion 15g is positioned.

In this embodiment, the positioning means is mainly composed of the side wall section of the socket body 13 and the engaging projection 16h.

The other structures and functions of this fourth embodiment are substantially the same as those of the first embodiment, so that the details thereof are omitted herein.

It is to be noted that, although in the described embodiments, the present invention is applied to the IC socket 11 as "socket for electrical parts", the present invention is not limited to this socket and may applied to other devices, and moreover, that in the described embodiments, there is adopted the IC socket having four-terminal structure in which upper and lower two different-type contact pins are contacted to one terminal 12b, but the present invention may be applied to an embodiment in which the upper and lower contact pins are composed as one contact pin having upper and lower contact portions contacting one terminal 12b, that is, applicable to so-called two-point type IC socket. Furthermore, as the positioning means, the terminal 12b pressed by the pressing force of the upper—'contact pin 15 can be positioned by stopping the displacement of the upper contact pin 15 at a predetermined position.

According to the present invention, other changes and modifications may be made, than the above examples, without departing from the scopes of the appended claims.

What is claimed is:

1. A socket for an electrical part adapted to be electrically connected to a terminal of an electrical part, comprising:

a socket body;

upper and lower contact pins mounted so as to be contacted to and separated from the terminal of the electrical part, said upper contact pin being formed with an upper elastic piece having an upper contact portion contacting an upper surface of the terminal and said lower contact pin being formed with a lower elastic piece having a lower contact portion contacting a lower surface of the terminal; and an operation member that is reciprocally movable with respect to the socket body, in which when said operation member is reciprocally moved, the upper contact portion is contacted to and separated from the upper surface of the terminal, wherein said socket body is provided with a partition wall section formed with a plurality of slits into each of which at least a portion of the lower contact pin is inserted and an upper portion of the lower contact portion is projected upwardly beyond an upper surface of the partition wall section, said partition wall section is provided, between the lower contact portions, with a protruded porticin projecting upwardly beyond an upper surface of the lower contact portions of the lower contact pins, and side surfaces of the terminal are guided by the protruded portion, in such a way that the terminal is prevented from being intruded between two adjacent lower contact portions, when the electrical part is mounted on the socket.

2. A socket for an electrical part according to claim 1, wherein a plurality of upper and lower contact pins is arranged an said protruded portion is formed on a portion of the partition wall section between one lower contact pin disposed at an endmost position and another lower contact pin disposed adjacent thereto.

3. A socket for an electcal part according to claim 1, wherein said protruded portion has a rounded top surface portion.

4. A socket for an electrical part according to claim 1, wherein when the upper contact portion contacts the upper surface of the terminal of the electrical part, and the lower contact portion contacts the lower surface of the terminal, so that the terminal is clamped between the upper and lower contact portions, said lower elastic piece is elastically deformed by an elastic force of the upper elastic piece to slidably move the lower contact portion along the terminal or the electrical part.

5. A socket for an electrical part according to claim 1, wherein said upper contact pin and said lower contact pin are formed integrally as one member.

\* \* \* \* \*